US011388810B2

(12) United States Patent
Kurunczi et al.

(10) Patent No.: US 11,388,810 B2
(45) Date of Patent: Jul. 12, 2022

(54) SYSTEM, APPARATUS AND METHOD FOR MULTI-FREQUENCY RESONATOR OPERATION IN LINEAR ACCELERATOR

(71) Applicant: Applied Materials, Inc., Santa Clara, CA (US)

(72) Inventors: Peter F. Kurunczi, Cambridge, MA (US); David T. Blahnik, Gloucester, MA (US); Frank Sinclair, Boston, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/024,295

(22) Filed: Sep. 17, 2020

(65) Prior Publication Data

US 2022/0087004 A1    Mar. 17, 2022

(51) Int. Cl.
*H05H 7/22* (2006.01)
*H01J 37/317* (2006.01)
*H05H 9/00* (2006.01)

(52) U.S. Cl.
CPC ........... *H05H 7/22* (2013.01); *H01J 37/3171* (2013.01); *H05H 9/00* (2013.01); *H05H 2007/222* (2013.01)

(58) Field of Classification Search
None
See application file for complete search history.

(56) References Cited

U.S. PATENT DOCUMENTS

| | | | | |
|---|---|---|---|---|
| 5,796,219 A * | 8/1998 | Hirakimoto | ............ | H05H 7/12 315/500 |
| 5,801,488 A * | 9/1998 | Fujisawa | .................. | H05H 9/00 250/492.21 |
| 6,242,747 B1 * | 6/2001 | Sugitani | .................. | H05H 9/00 250/251 |
| 6,262,638 B1 * | 7/2001 | Scherer | .................... | H01J 5/34 333/174 |
| 6,291,828 B1 * | 9/2001 | Saadatmand | ........... | H01J 37/12 250/492.21 |

(Continued)

FOREIGN PATENT DOCUMENTS

JP    07-105860 A    4/1995

OTHER PUBLICATIONS

International Search Report and Written Opinion dated Nov. 17, 2021, for the International Patent Application No. PCT/US2021/043484, filed on Jul. 28, 2021, 7 pages.

*Primary Examiner* — Srinivas Sathiraju
(74) *Attorney, Agent, or Firm* — KDB Firm PLLC

(57) ABSTRACT

An apparatus, system and method. An apparatus may include an RF power assembly, arranged to output an RF signal; a resonator, coupled to receive the RF signal, the resonator comprising a first output end and a second output end, and a drift tube assembly, configured to transmit an ion beam, and coupled to the resonator. As such, the drift tube assembly may include a first AC drift tube electrode, coupled to the first output end, and a second AC drift tube electrode, coupled to the second output end and separated from the first AC drift tube by a first gap. The RF power assembly may be switchable to switch output from a first Eigenmode frequency to a second Eigenmode frequency.

18 Claims, 9 Drawing Sheets

(56) References Cited

U.S. PATENT DOCUMENTS

| | | | | |
|---|---|---|---|---|
| 6,320,334 | B1* | 11/2001 | Roberge | H01J 37/304 250/492.2 |
| 6,326,746 | B1* | 12/2001 | Chen | H05H 9/00 315/5.41 |
| 6,423,976 | B1* | 7/2002 | Glavish | H01J 37/3171 250/492.21 |
| 6,777,893 | B1* | 8/2004 | Swenson | H05H 7/22 315/505 |
| 6,949,895 | B2* | 9/2005 | DiVergilio | H01J 37/12 315/505 |
| 7,098,615 | B2* | 8/2006 | Swenson | H05H 7/22 315/505 |
| 7,767,561 | B2* | 8/2010 | Hanawa | H01J 37/32357 438/514 |
| 9,269,541 | B2* | 2/2016 | Inada | H01J 37/3171 |
| 10,651,011 | B2* | 5/2020 | Sinclair | H01J 37/20 |
| 2002/0084427 | A1 | 7/2002 | Saadatmand et al. | |
| 2009/0314949 | A1* | 12/2009 | Plettner | H05H 7/06 250/397 |
| 2010/0072401 | A1* | 3/2010 | Parrill | H01J 37/20 250/492.21 |
| 2010/0072405 | A1* | 3/2010 | Yu | H01J 25/02 250/493.1 |
| 2014/0345522 | A1* | 11/2014 | Kabasawa | H01J 37/317 118/688 |
| 2018/0120504 | A1* | 5/2018 | Qi | G02B 5/1809 |
| 2018/0276164 | A1* | 9/2018 | Das Sharma | H01L 23/5386 |
| 2019/0371562 | A1* | 12/2019 | Sinclair | H05H 9/00 |
| 2020/0066486 | A1* | 2/2020 | Sinclair | H01J 37/20 |
| 2020/0234918 | A1* | 7/2020 | Sinclair | H01J 37/3171 |
| 2020/0357603 | A1* | 11/2020 | Sinclair | H01J 37/3007 |
| 2021/0307152 | A1* | 9/2021 | Kowal | H05H 7/22 |

* cited by examiner

| LENGTH OF π DRIFT @ 13.56MHz (cm) | | | | |
|---|---|---|---|---|
| ELEMENT | | B | P | As |
| A(amu) | | 11 | 31 | 75 |
| ENERGY (MeV) | 0.08 | 4.4 | 2.6 | 1.7 |
| | 0.2 | 6.9 | 4.1 | 2.6 |
| | 0.5 | 11 | 6.5 | 4.2 |
| | 1 | 15 | 9.2 | 5.9 |
| | 2 | 22 | 13 | 8.4 |
| | 3 | 27 | 16 | 10 |
| | 4 | 31 | 18 | 12 |
| | 5 | 35 | 21 | 13 |
| | 6 | 38 | 23 | 14 |
| | 10 | 49 | 29 | 19 |

| LENGTH OF π DRIFT @ 40MHz (cm) | | | | |
|---|---|---|---|---|
| ELEMENT | | B | P | As |
| A(amu) | | 11 | 31 | 75 |
| ENERGY (MeV) | 0.08 | 1.5 | 0.9 | 0.6 |
| | 0.2 | 2.3 | 1.4 | 0.9 |
| | 0.5 | 3.7 | 2.2 | 1.4 |
| | 1 | 5.2 | 3.1 | 2.0 |
| | 2 | 7.4 | 4.4 | 2.8 |
| | 3 | 9.1 | 5.4 | 3.5 |
| | 4 | 10 | 6.2 | 4.0 |
| | 5 | 12 | 7.0 | 4.5 |
| | 6 | 13 | 7.6 | 4.9 |
| | 10 | 17 | 10 | 6.3 |

$L = V/(2F) = \sqrt{2E/M}/(2F)$

FIG. 5A

SYSTEM, APPARATUS AND METHOD FOR MULTI-FREQUENCY RESONATOR OPERATION IN LINEAR ACCELERATOR

FIELD OF THE DISCLOSURE

The disclosure relates generally to ion implantation apparatus and more particularly to high energy beamline ion implanters.

BACKGROUND OF THE DISCLOSURE

Ion implantation is a process of introducing dopants or impurities into a substrate via bombardment. Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp.

Implantation apparatus capable of generating ion energies of approximately 1 MeV or greater are often referred to as high energy ion implanters, or high energy ion implantation systems. One type of high energy ion implanter is termed linear accelerator, or LINAC, where a series of electrodes arranged as tubes conduct and accelerate the ion beam to increasingly higher energy along the succession of tubes, where the electrodes receive an AC voltage signal. Known (RF) LINACs are driven by an RF voltage applied at 13.56 MHz-120 MHz. One issue for operation of RF LINAC ion implanters is that the acceleration stages are arranged for accelerating ions having a specific mass/charge ratio (M/q) so that a maximum amount of ions can be conducted through the acceleration stages. In order to efficiently conduct different ions having different M/q ratios, hardware changes, such as changing the electrode lengths of drift tube electrodes may be needed. With respect to these and other considerations the present disclosure is provided.

BRIEF SUMMARY

In one embodiment, an apparatus may include an RF power assembly, arranged to output an RF signal; a resonator, coupled to receive the RF signal, the resonator comprising a first output end and a second output end; and a drift tube assembly, configured to transmit an ion beam, and coupled to the resonator. As such, the drift tube assembly may include a first AC drift tube electrode, coupled to the first output end, and a second AC drift tube electrode, coupled to the second output end and separated from the first AC drift tube by a first gap. The RF power assembly may be switchable to switch output from a first Eigenmode frequency to a second Eigenmode frequency.

A method of operating a linear accelerator is provided. The method may include directing a first ion beam through a drift tube assembly. The drift tube assembly may include a first AC drift tube electrode, coupled to a first output end of a resonator, and a second AC drift tube electrode, coupled to a second output end of the resonator and separated from the first AC drift tube by a first gap. The method may include delivering an RF signal to the resonator at a first frequency, the first frequency representing a second Eigenmode of the resonator.

A high energy ion implantation system is provided. The high energy ion implantation system may include an ion source and extraction system, arranged to generate an ion beam at a first energy; and a linear accelerator, disposed downstream of the analyzer. As such, the linear accelerator may be arranged to accelerate the ion beam to a second energy, greater than the first energy. The linear accelerator may include a plurality of acceleration stages; an RF power system, comprising a plurality of RF power assemblies, and arranged to output a plurality of RF signals individually to the plurality of acceleration stages. The RF power system may be arranged to send a first RF signal to the linear accelerator corresponding to a first Eigenmode frequency for a first resonator of the plurality of acceleration stages, and to send a second RF signal to the linear accelerator corresponding to a second Eigenmode frequency for a second resonator of the plurality of acceleration stages.

BRIEF DESCRIPTION OF THE DRAWINGS

FIG. 5A provides a listing of ideal tube length for different ion species, hydrogen, boron, and phosphorous, shown as a function of ion energy up to 10 MeV;

Figure 1:
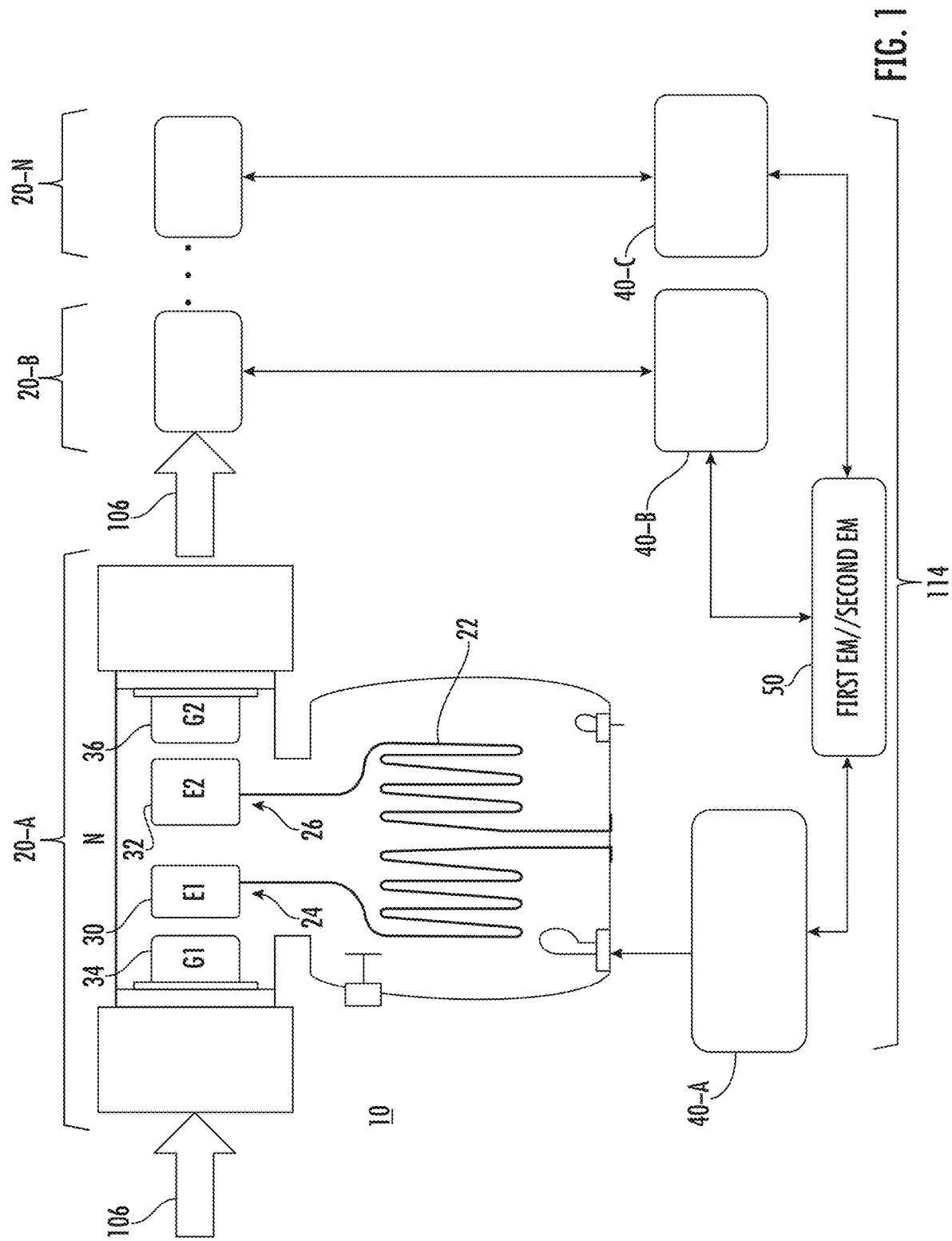
FIG. 1 shows an exemplary apparatus, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved high energy ion implantation systems and components, based upon a beamline architecture, and in particular, ion implanters based upon linear accelerators. For brevity, an ion implantation system may also be referred to herein as an "ion implanter." Various embodiments entail novel approaches that provide the capability of flexibly adjusting the effective drift length within acceleration stages of a linear accelerator.

FIG. 1 depicts a schematic of an apparatus, according to embodiments of the disclosure. The apparatus 10 includes an acceleration stage 20-A of a LINAC, shown as linear accelerator 114, as well as associated electrical circuitry, including an RF voltage source 40-A, and controller 50. As shown in FIG. 1, the linear accelerator 114 may include a plurality of acceleration stages, shown as acceleration stages 20-B . . . 20-N. In various embodiments, the one or more of the stages of the linear accelerator 114 may include the components of the acceleration stage 20-A as detailed herein.

Figure 1A:
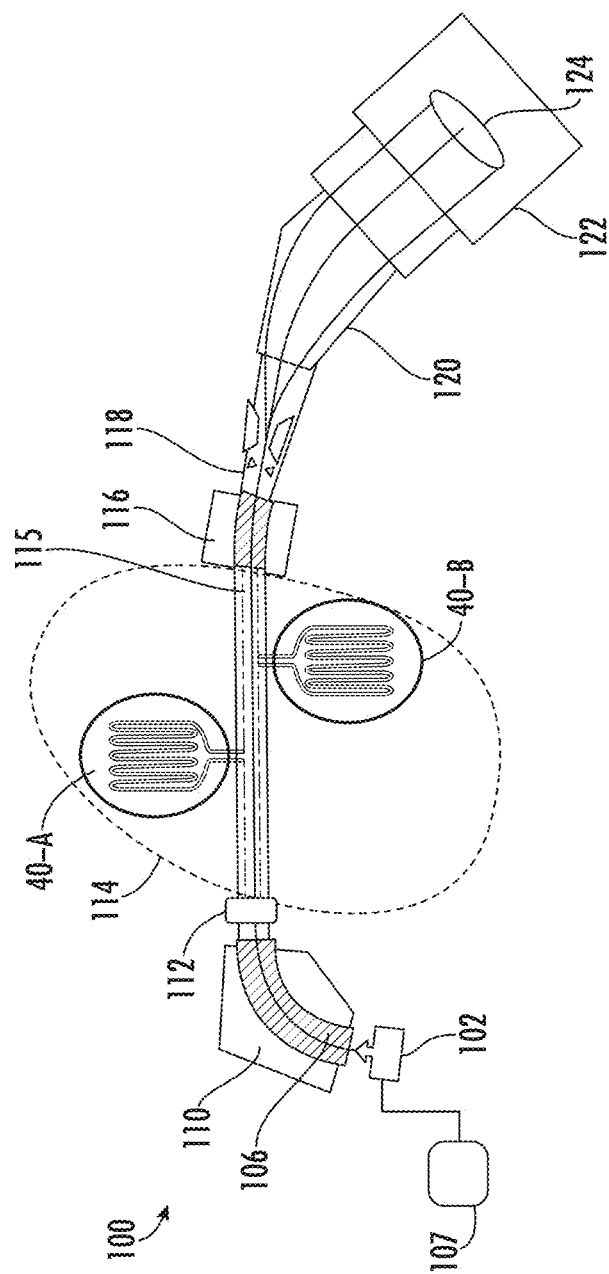
FIG. 1A shows an exemplary ion implantation system, according to embodiments of the disclosure.

To place the operation of apparatus 10 in context, FIG. 1A illustrates an ion implanter 100, which implanter may represent a beamline ion implanter, with some elements not shown for clarity of explanation. The ion implanter 100 may include an ion source 102, and a gas box 107 disposed in a terminal 104 as known in the art. The ion source 102 may include an extraction system including extraction components and filters (not shown) to generate an ion beam 106 at a first energy. Examples of suitable ion energy for the first ion energy range from 5 keV to 100 keV, while the embodiments are not limited in this context. To form a high energy ion beam, the ion implanter 100 includes various additional components for accelerating the ion beam 106.

The ion implanter 100 may include an analyzer 110, functioning to analyze the ion beam 106 as in known apparatus, by changing the trajectory of the ion beam 106, as shown. The ion implanter 100 may also include a buncher 112, and a linear accelerator 114 (shown in the dashed line), disposed downstream of the buncher 112, where the linear accelerator 114 is arranged to accelerate the ion beam 106 to form a high energy ion beam 115, greater than the ion energy of the ion beam 106, before entering the linear accelerator 114. The buncher 112 may receive the ion beam 106 as a continuous ion beam and output the ion beam 106 as a bunched ion beam to the linear accelerator 114. The linear accelerator 114 may include a plurality of acceleration stages (20-A to 20-N), arranged in series, as shown. In various embodiments, the ion energy of the high energy ion beam 115 may represent the final ion energy for the ion beam 106, or approximately the final ion energy. In various embodiments, the ion implanter 100 may include additional components, such as filter magnet 116, a scanner 118, collimator 120, where the general functions of the scanner 118 and collimator 120 are well known and will not be described herein in further detail. As such, a high energy ion beam, represented by the high energy ion beam 115, may be delivered to an end station 122 for processing a substrate 124. Non-limiting energy ranges for the high energy ion beam 115 include 500 keV-10 MeV, where the ion energy of the ion beam 106 is increased in steps through the various acceleration stages of the linear accelerator 114.

Returning to FIG. 1, where details of one acceleration stage are shown, the acceleration stage 20-A is arranged as triple gap electrode assembly. The terms "triple gap" "or triple gap configuration" as used herein may refer to the presence of three gaps between electrodes within a given acceleration stage. In the acceleration stage 20-A the electrode assembly includes a first grounded drift tube electrode 34, also shown as G1, a first AC drift tube electrode 30, also shown as E1, a second AC drift tube electrode 32, also shown as E2, and a second grounded drift tube electrode 36, also shown as G2. This configuration of electrodes are all arranged as hollow conductive cylinders to conduct an ion beam 106 therethrough. According to various embodiments of the disclosure, the ion beam 106 may be received as a bunched ion beam, meaning that the ion beam 106 is received as a plurality of packets that are separated from one another. Thus, different ion packets of the ion beam 106 arrive at the acceleration stage 20-A at different times, and are accordingly accelerated and conducted through the acceleration stage 20-A in sequence.

As shown in FIG. 1, the RF voltage source 40-A is electrically coupled to a resonator 22, to drive an RF voltage signal within the resonator 22. Similar resonators may be included in the other acceleration stages of the LINAC 114, and in some embodiments may be individually coupled to dedicated RF voltage sources, shown as RF voltage sources 40-B . . . 40-N. The resonator 22 has a first output end 24, coupled to the first AC drift tube electrode 30, and a second output end 26, coupled to the second AC drift tube electrode 32. When an RF voltage is sent to the resonator 22, the resonator 22 may resonate according to the frequency of the RF voltage and the configuration of the resonator 22. More particularly, the resonator 22 will exhibit a fundamental (resonance) frequency, corresponding to a first Eigenmode frequency.

As in known linear accelerators, the resonator 22 may be excited at the fundamental frequency. When the resonator 22 is excited at the fundamental frequency of resonator 22 the instantaneous voltage appearing on the first AC drift tube electrode 30, and on the second AC drift tube electrode 32 will oscillate with equal magnitudes and opposite polarities. In such a scenario, each of the AC drift tube electrodes will accelerate the ion beam 106 within each of three gaps formed by the triple gap configuration, shown by the Gap1, Gap2, and Gap3 notation in FIG. 2, and discussed in more detail below.

According to embodiments of the disclosure, the apparatus 10 may be adjustable to send an RF signal to the resonator 22 at a plurality of frequencies. For example, the controller 50 and RF voltage source 40-A may be deemed to form an RF power assembly that is switchable to switch output of an RF voltage signal from a first Eigenmode frequency to a second Eigenmode frequency (shown schematically within controller 50), where the first Eigenmode frequency and second Eigenmode frequency are characteristic of the resonator 22. Notably, the ability to switch between different discrete frequencies, characteristic of different Eigenmodes of the resonator 22 confers various advantages to the acceleration stage 20-A, as discussed with respect to the figures to follow.

Figure 2:
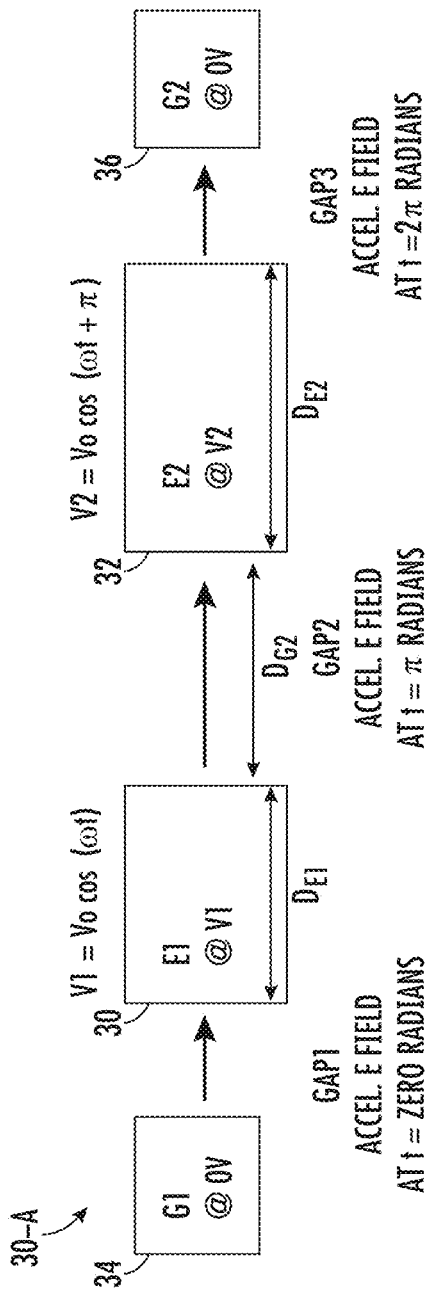
FIG. 2 illustrates general features of a drift tube assembly under a first scenario for operating a resonator.
Figure 3:
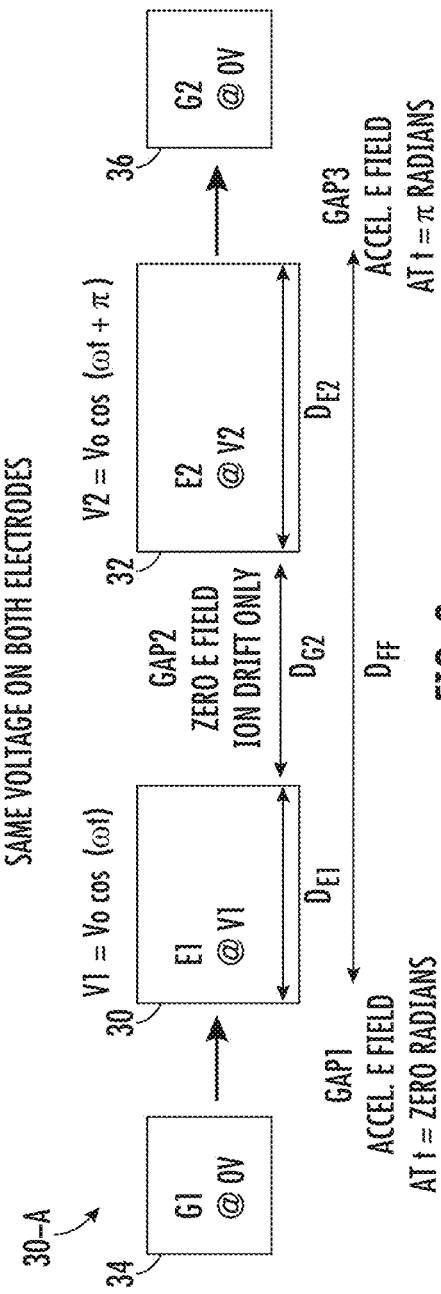
FIG. 3 illustrates the electrical characteristics of the drift tube assembly of FIG. 2 under a second scenario for operating a resonator.

FIG. 2 and FIG. 3 illustrate the difference between two modes of operation of the acceleration stage 20-A. In particular, FIG. 2 is a block diagram that illustrates general features of a drift tube assembly 30-A under a first scenario for operating the resonator 22 (not shown). The drift tube assembly 30-A includes the aforementioned electrodes of FIG. 1, referred to as E1, E2, G1, and G2. As shown in FIG. 2, a gap is present between each successive pair of electrodes. The Gap1 is present between the first grounded drift tube electrode 34, and the first AC drift tube electrode 30, a Gap2 is present between the first AC drift tube electrode 30 and the second AC drift tube 32, and a Gap3 is present between the second grounded drift tube electrode 36, and the second AC drift tube 32.

When an RF voltage is applied to the resonator 22, the first AC drift tube electrode 30 and the second AC drift tube 32 will experience an oscillating voltage, shown in FIG. 2 as V1 and V2, respectively. When the resonator 22 is operated at a fundamental frequency operation, the oscillating voltage experienced by the first AC drift tube electrode 30 and the second AC drift tube electrode 32 will create a "triple gap" acceleration stage. The first acceleration gap occurs between the first grounded drift tube electrode 34, and the first AC drift tube electrode 30, and corresponds to the physical gap, that is Gap1. A second acceleration gap corresponding to Gap2 is present between the first AC drift tube 30 and the second AC drift tube electrode 32, and a third acceleration gap corresponding to Gap3 is present between the second grounded drift tube electrode 36, and the second AC drift tube electrode 32.

In other words, since the first grounded drift tube electrode 34 remains fixed at ground potential, an oscillating potential difference across Gap1 will take place between the first grounded drift tube electrode 34, and the first AC drift tube electrode 30, as the RF voltage is received from the resonator 22 from a first end. Because the second AC drift tube electrode 32 is coupled to the resonator 22 on a second end (see FIG. 1) and the resonator is operating at the fundamental frequency or first eigenmode, the instantaneous voltages at the first AC drift tube electrode 30 and the second AC drift tube electrode 32 will be of opposite polarity, creating a second potential difference across the gap Gap2. As shown in FIG. 2, the voltage V1 at the first drift tube electrode 30 may be represented by V1=Vo cos(ωt), while the voltage of second AC drift tube electrode 32 is given by V2=Vo cos(ωt+π). In the configuration where V1 and V2 are out of phase with one another by 180 degrees (π) the frequency (ω) of operation for the scenario of FIG. 2 corresponds to the first Eigenmode of the resonator 22. Since the second grounded drift tube electrode 36 remains fixed at ground potential, an oscillating potential difference across Gap3 will take place between the second grounded drift tube electrode 36, and the second AC drift tube electrode 32, as the RF voltage is received from the resonator 22 from a second end. These gaps create a first accelerating electric field at t=zero radians, a second accelerating electric field at t=π radians, and a third accelerating electric field at t=2π radians, across Gap1, Gap2, and Gap3, respectively.

Under the mode of operation shown in FIG. 2, the drift tube assembly 30-A thus acts to accelerate an ion beam 106 through three gaps, where the length of the various drift tube electrodes along the direction of beam transport (horizontal axis in the figure) may be tailored to optimize transport of the ion beam 106 in bunched packets. The length of first AC drift tube electrode 30 is shown as $D_{E1}$, while the length of second AC drift tube electrode is shown as $D_{E2}$. These lengths may be optimized to accelerate a packet of ions at a given ion energy and M/q ratio to yield a maximum ion acceleration through the drift tube assembly 20-A. For a given ion energy and M/q ratio, the length $D_{E1}$ may be set so that a packet of ions drifts through the first AC drift tube electrode 30 for a predetermined time, based upon the frequency of the applied RF voltage signal. The timing of this drift time will ensure that the packet of ions are received in the second drift tube electrode 32 when at the appropriate point in the cycle of the RF voltage signal to maximally accelerate the packet of ions. Notably, the length of second AC drift tube electrode 32 is shown as may be longer than $D_{E1}$ to account for the relatively higher energy of ions traversing the second AC drift tube electrode 32.

The scenario for operation of FIG. 2 may be especially appropriate for ions having a relatively lower ion energy and/or having a relatively higher M/q ratio, where the velocity of the ions, and therefore the drift time, is relatively lower.

FIG. 3 is a block diagram that illustrates general features of the drift tube assembly 30-A under a second scenario for operating the resonator 22 (not shown). In this scenario, the resonator 22 is operated at a second higher frequency (also shown as w), corresponding to the second Eigenmode of resonator 22. According to embodiments of the disclosure, the ratio of the fundamental frequency or first Eigenmode frequency of FIG. 2 to the second Eigenmode frequency of FIG. 3 is $1/\sqrt{2}$. According to some embodiments, the first Eigenmode frequency is at least 13.56 MHz, including frequencies of 20 MHz, or 27.12 MHz, or 40 MHz. Thus, for a given first Eigenmode frequency, the second Eigenmode frequency will be a factor of $\sqrt{2}$ greater. This "2nd harmonic operation" of FIG. 3 may be especially suitable for operation of ion implanters when accelerating relatively lower M/q ions at higher energies. Consistent with the aforementioned discussion, relatively higher velocity ions will require relatively longer drift tube lengths to increase the time-of-flight between acceleration gaps, in order that the arrival time of the ions coincides with the peak voltage phase of a given oscillating-voltage electrode. The operating scenario of FIG. 3 accomplishes this feat in the following manner.

In the scenario of FIG. 3 (as well as in FIG. 2), the applied RF voltage is applied to the drift tube assembly through resonator 22, as shown in the configuration of FIG. 1. Because the frequency of the RF voltage represents the second Eigenmode (second harmonic) of the resonator 22, the oscillating voltage at first AC drift tube electrode 30, given by V=Vo cos(ωt) is the same magnitude and same polarity as the oscillating voltage at second AC drift tube electrode 32 (V=Vo cos(ωt)) at any given instant. This circumstance results in several characteristic features of the drift tube assembly 20-A when operating at the second Eigenmode frequency. In contrast to the scenario of FIG. 2, the three physical gaps of the drift tube assembly 20-a create a first accelerating electric field at t=zero radians across Gap1, and a second accelerating electric field at t=π radians across Gap3, while no accelerating field exists across the Gap2. Thus, just Gap1 and Gap3 act as accelerating gaps, while the Gap3 does not act as an accelerating gap. Said differently, the operation scenario of FIG. 3 may be deemed to turn the drift tube assembly 20-A into a double gap acceleration stage in the sense of possessing just two accelerating gaps.

Figure 4:
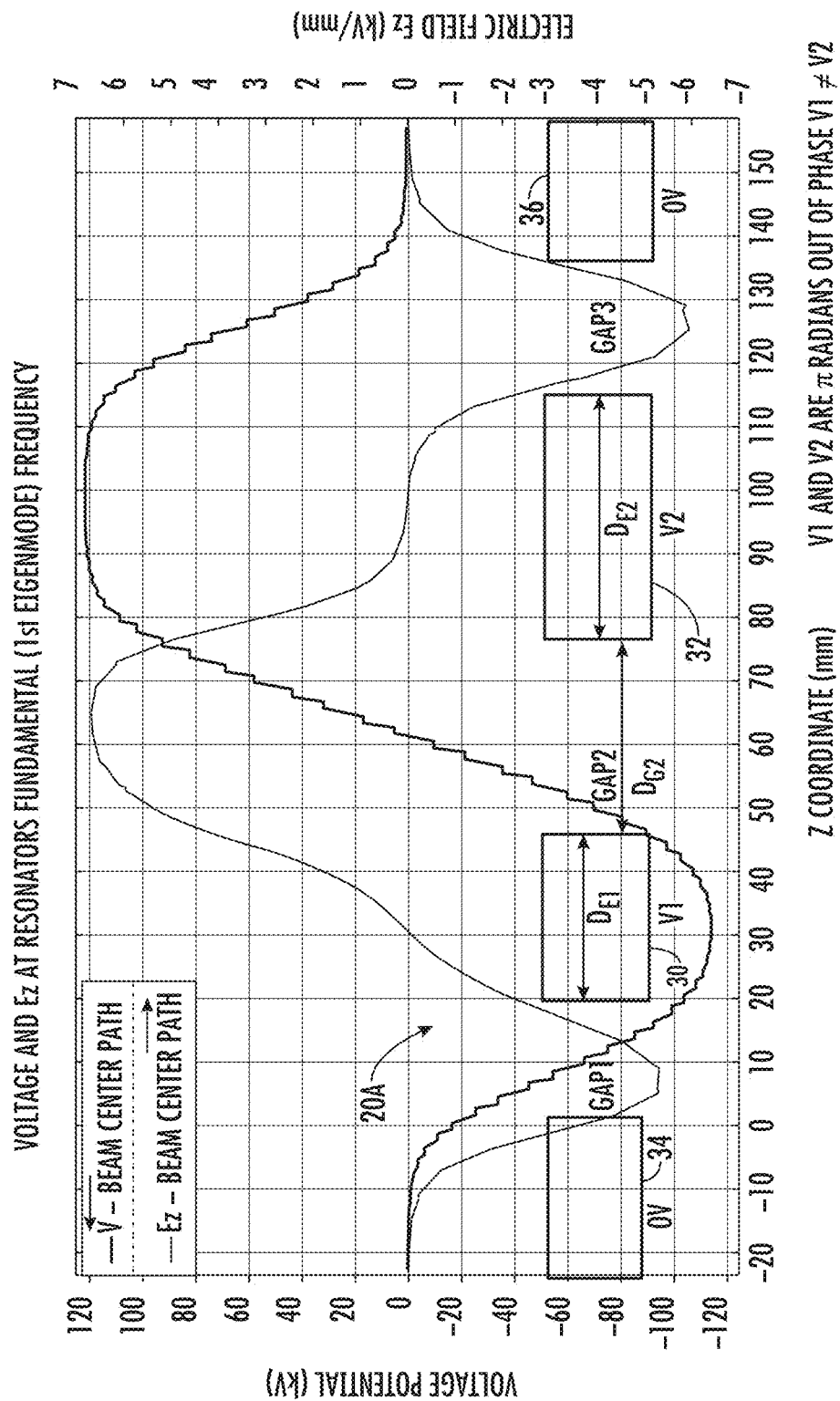
FIG. 4 illustrates the electrical characteristics as a function of position of the drift tube assembly of FIG. 2 under the first scenario for operating a resonator.
Figure 5:
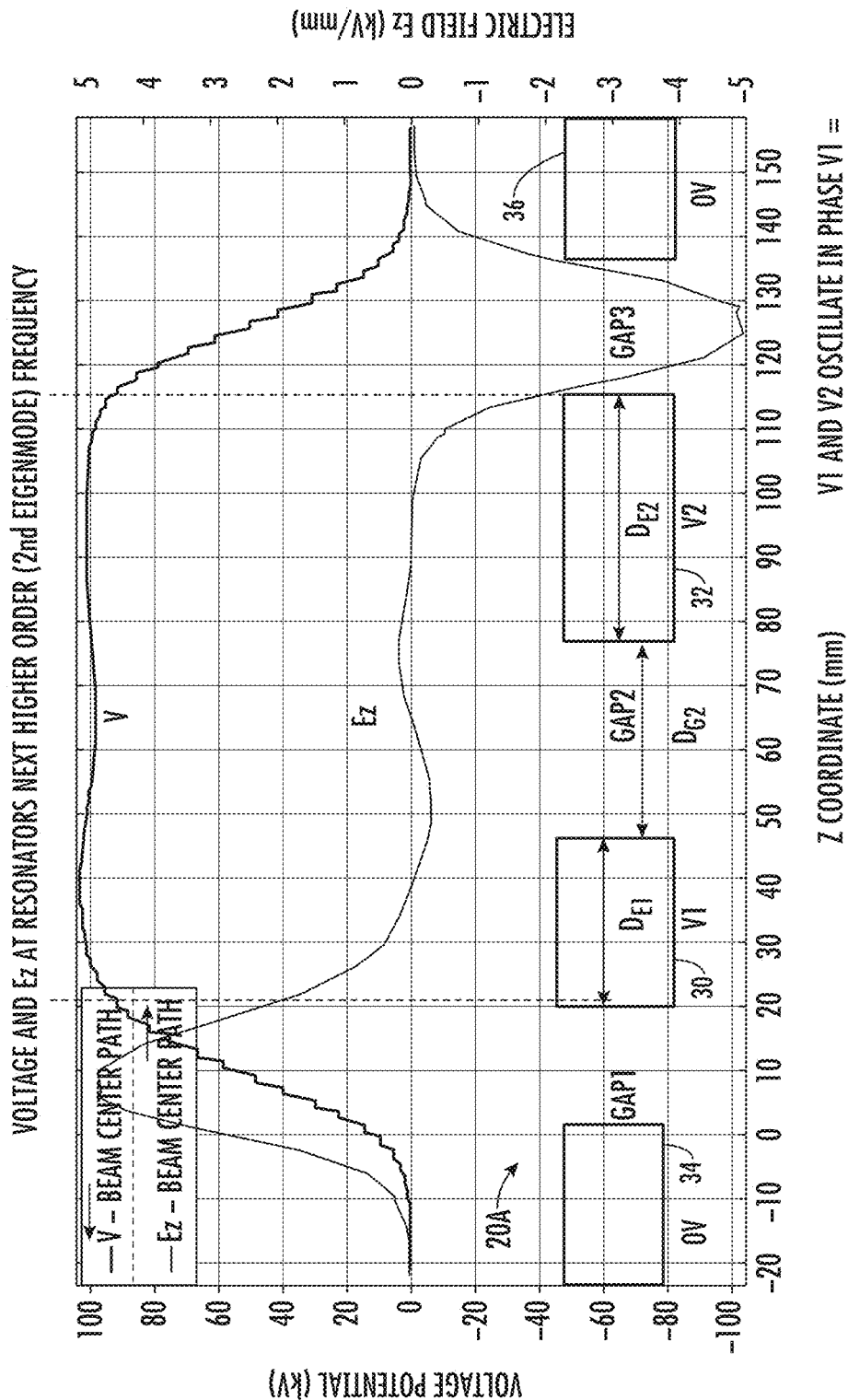
FIG. 5 illustrates the electrical characteristics as a function of position of the drift tube assembly of FIG. 3 under the second scenario for operating a resonator.

To further explain operation of the present embodiments, FIG. 4 illustrates the electrical potential and the electric field as a function of position of the drift tube assembly 20-A of FIG. 2 under the first scenario for operating the resonator 22, where the applied voltage has a frequency characteristic of the first Eigenmode of the resonator 22. FIG. 5 illustrates the electrical characteristics as a function of position of the drift tube assembly of FIG. 3 under the second scenario for operating the resonator 22, where the applied voltage has a frequency that is characteristic of the second Eigenmode of the resonator 22.

In particular, FIG. 4 shows a simulated voltage and electric field distribution along the z coordinate as a function of position along the direction of propagation of the ion beam (shown as Z-coordinate or axis, in meters). In the instance depicted in FIG. 4 and FIG. 5, the maximum amplitude of the voltage shown is approximately 100,000 V, which voltage may correspond to the maximum amplitude of an RF voltage applied to a resonator 22. When resonating at the fundamental or first eigenfrequency, the voltages on first AC drift tube electrode 30 and second AC drift tube electrode 32 are π radians out of phase with each other, and remain so at any given time. When resonating at the second eigenfrequency, the voltages on first AC drift tube electrode 30 and second AC drift tube electrode 32 are the same. The voltage V represents the magnitude of applied voltage at a given instance in time as a function of position along the Z-coordinate, while the electric field Ez, represents the magnitude of the electric field along the Z-direction (meaning along the Z-axis) as a function of position along the Z-coordinate. Thus, the greater the magnitude of Ez, the greater the accelerating field along the Z-axis, tending to accelerate ions to higher energies.

In principle, the voltage will be zero in the first grounded drift tube electrode 34, and the curve V exhibits a value close to zero until the Z-coordinate=0, corresponding to the exit (downstream) side of the first grounded drift tube electrode 34. The voltage then drops across the gap Gap1 to a −100,000 V at the entrance to the first AC drift tube electrode 30. Within the first AC drift tube electrode 30, the voltage is constant, and then switches to a +100,000 V potential across the Gap2. Within the second AC drift tube electrode 32, the voltage is constant, and then decreases to 0 V potential across the Gap3. The concomitant electric field that develops, exhibits a zero magnitude within the first grounded drift tube electrode 34, and increases to a value of approximately −4.5 E6 V/m in the middle of Gap1, decreasing to approximately zero within the first AC drift tube electrode 30. The concomitant electric field increases to a value of approximately +4.5 E6 V/m in the middle of Gap2, decreasing to approximately zero within the second AC drift tube electrode 32. The concomitant electric field that develops, also switches to a value of approximately −4.5 E6 V/m in the middle of Gap3, decreasing to approximately zero within the second grounded drift tube electrode 36. Thus, three different accelerating gaps are formed in the configuration of FIG. 4, where the magnitude of the accelerating field may reach 4.5 E6 V/m.

As noted, FIG. 5 shows the voltage and electric field distribution for the same resonator topology and drift tube assembly as shown in FIG. 4, but with the resonator 22 operated with an RF voltage applied at a next highest harmonic frequency (meaning the 2nd Eigenmode). The voltages appearing on first AC drift tube electrode 30 and second AC drift tube electrode 32 now simultaneously oscillate with equal magnitudes and same polarities.

In principle, the voltage will be zero in the first grounded drift tube electrode 34, and the curve V exhibits a value close to zero until the Z-coordinate=0, corresponding to the exit (downstream) side of the first grounded drift tube electrode 34. The voltage then increases across the gap Gap1 to a +~100,000 V at the entrance to the first AC drift tube electrode 30. Within the first AC drift tube electrode 30 the voltage is constant, and across Gap2 remains nearly constant, continues to remain constant within second AC drift tube electrode 32, then decrease to zero across the Gap3. The concomitant electric field that develops, exhibits a zero magnitude within the first grounded drift tube electrode 34, and increases to a value of approximately +4 E6 V/m in the middle of Gap1, decreasing to approximately zero within the first AC drift tube electrode 30. The concomitant electric field also exhibits a near-zero magnitude within the gap Gap2 and within the second AC drift tube electrode 32, drops to a value of approximately −4 E6 V/m in the middle of Gap3, returning to zero within the second grounded drift tube electrode 36.

Thus, the configuration of FIG. 5 provides just two accelerating gaps, corresponding to Gap1 and Gap3, while no acceleration takes place across Gap2. Said differently, by effectively tying the voltages on the two AC drift tube electrodes together with zero electrode field across Gap2, the configuration of FIG. 5 creates a longer quasi-drift tube that mimics a known long drift tube double gap acceleration stage by increasing the field free drift spacing between successive acceleration gaps (Gap1 and Gap3). More particularly, where a first length of a first AC drift tube electrode is represented by $D_{E1}$, a second length of a second AC drift tube electrode is represented by $D_{E2}$, the drift tube assembly 20-A of FIG. 5 is characterized by a field free region extending a distance along the axial direction (z-axis) equal to a sum of the first length $D_{E1}$, the second length $D_{E2}$, and the gap $D_{G2}$. In the non-limiting example of FIG. 5, this field free region is approximately 0.1 m, much longer than the length of either of the AC drift tube electrodes shown.

To illustrate the advantage of creating a longer effective drift tube, FIG. 5A provides a listing of ideal tube length for different ion species, hydrogen, boron, and phosphorous, shown as a function of ion energy up to 10 MeV. This length is the distance the specified ion travels in a time corresponding to 180° or π radians of the AC voltage. The tube length is also a function of signal frequency, and is shown for 13.56 MHz, commonly used in linear accelerators, as well as for a frequency of 40 MHz. Notably, for every ion energy, and at both frequencies shown, switching from phosphorous ions to boron ions corresponds to an increase in ideal drift tube length of more than a factor of 2. Additionally, as ion energy increases within a given species, the ideal drift tube length increases. For example, for accelerating boron ions using a 40 MHz RF resonator, increasing ion energy from 500 keV to 2 MeV increases the ideal drift tube length from 3.7 cm to 7.4 cm.

In view of the above considerations, the drift tube assembly 20-A may be switched from operating at a frequency corresponding to a first Eigenmode of a resonator to a frequency corresponding to a second Eigenmode, when ion energy is to be increased or when the M/q ratio of an ion species is to be decreased. This flexibility may avoid the need to perform extensive hardware changes that otherwise would in order to optimize performance when changing ion species or ion energy.

Figure 6:
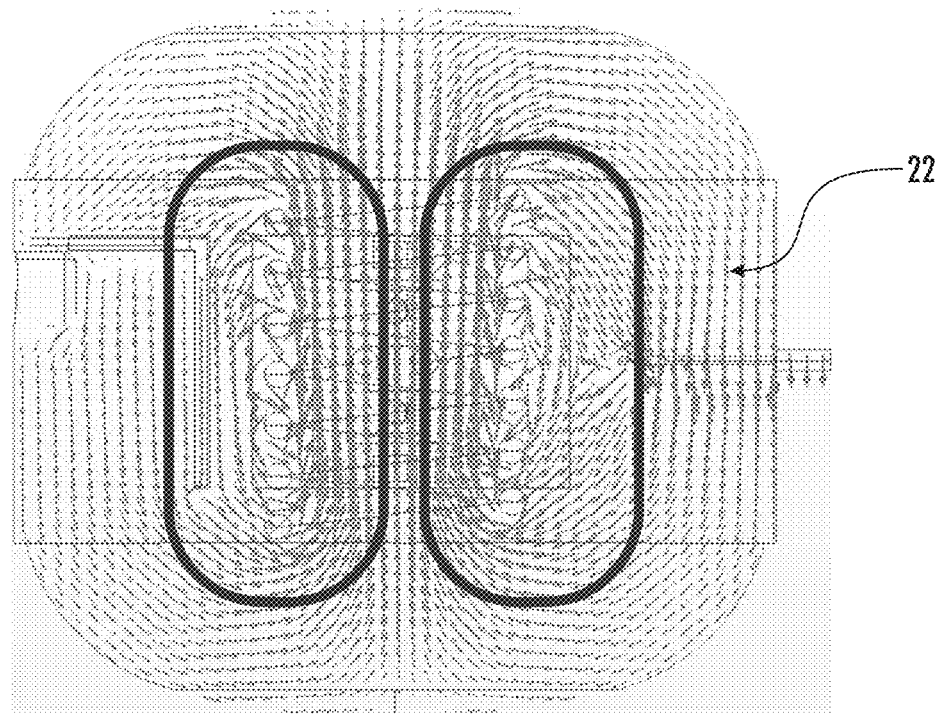
FIG. 6 presents modeling results for operating a triple gap LINAC drift tube configuration at one frequency.
Figure 7:
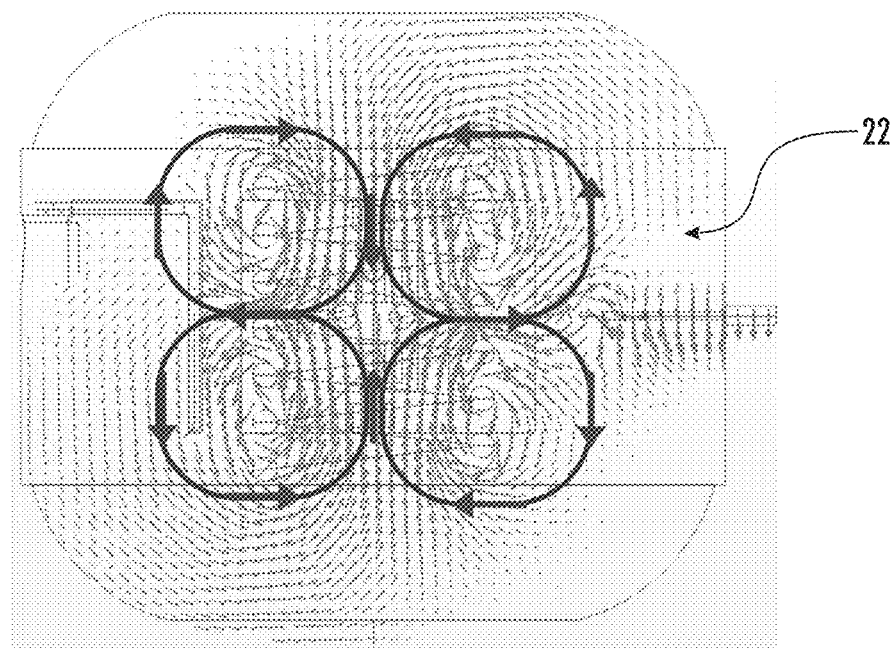
FIG. 7 presents modeling results for operating a triple gap LINAC drift tube configuration at a second frequency.

FIG. 6 presents modeling results for operating a triple gap LINAC drift tube configuration at one frequency, while FIG. 7 presents modeling results for operating a triple gap LINAC drift tube configuration at a second frequency. More particularly, FIG. 6 shows the magnetic field lines around the resonator coil of resonator 22 when a triple gap accelerator is operating at the fundamental frequency (1st eigenmode), while FIG. 7 shows the magnetic field lines when the same resonator is operating at the next highest harmonic (2nd eigenmode). In FIG. 7 the fields line directions bifurcate through the middle of the resonator coil. This more complicated path for the magnetic field produces a larger voltage for the same rate of change of current, so that the coil displays an effectively greater self inductance and the second eigenmode resonant frequency is larger than the frequency of the first eigenmode.

Returning to FIG. 1 and FIG. 2, according to further embodiments of the disclosure, an RF signal may be selectively applied at a second Eigenmode frequency to select acceleration stages of a linear accelerator. For example, a first RF signal may be applied to the acceleration stage 30-A at a first Eigenmode (fundamental) frequency of the resonator 22, while a second RF signal may be applied to the acceleration stage 20-B at a second Eigenmode (fundamental) frequency of a similar resonator 22. Because the ion energy will be higher in a second acceleration stage disposed downstream of a first acceleration stage, the creation of an effective "double gap" acceleration stage may be appropriate to conduct relatively faster ions through an effectively longer drift tube formed from two separated AC drift tube electrodes, as disclosed above. On the other hand, for an upstream acceleration stage where the ion energy is relatively lower, the individual AC drift tube electrodes may be separately of sufficient length for transport of the ion beam with the appropriate timing.

Thus, the controller 50 may be employed to selectively switch the frequency of RF signals that are sent from an RF voltage supply to the appropriate acceleration stage between the first Eigenmode frequency and the second Eigenmode frequency, as appropriate for the given ion species, ion charge state, and ion energy.

Figure 8:
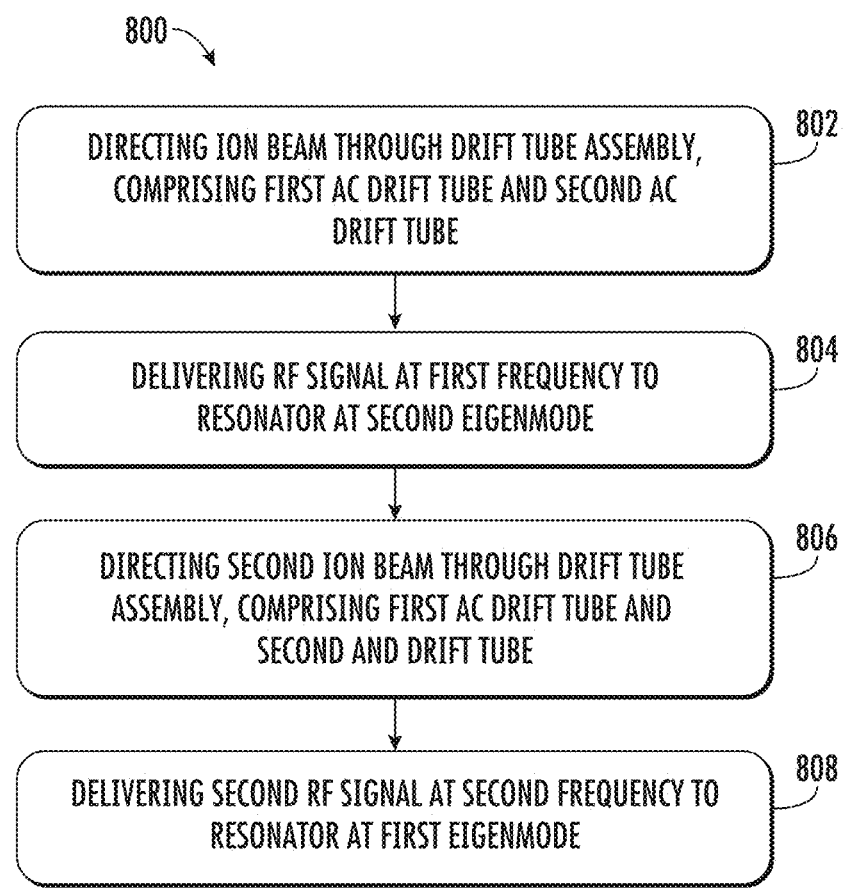
FIG. 8 presents an exemplary process flow.

FIG. 8 depicts an exemplary process flow 800. At block 802, the operation takes place of directing an ion beam through a drift tube assembly, comprising a first AC drift tube and a second AC drift tube. At block 804 an RF signal is delivered to a resonator coupled to the drift tube assembly at a frequency corresponding to a second Eigenmode of the drift tube assembly, while the ion beam is conducted therethrough. At block 806, a second ion beam is conducted through the drift tube assembly, where the second ion beam may have a lower energy or lower M/q ratio in comparison to the ion beam. comparison to the first ion beam. At block 808 a second RF signal at second frequency is applied to the resonator corresponding to a first Eigenmode of the resonator, while the second ion beam is conducted therethrough.

In view of the foregoing, at least the following advantages are achieved by the embodiments disclosed herein. By providing an approach to selectively apply RF signals to a resonator at a second Eigenmode frequency, the present approaches provide a first advantage of adjusting the effective AC drift tube length in a drift tube a drift tube assembly, without burdensome replacement of hardware within an acceleration stage. The present embodiments also provide a second advantage of expanding the capability of a LINAC based accelerator to process ions of multiple different masses without delay, since hardware changes to drift tube assemblies may be avoided. A further advantage afforded by the present embodiments is the ability to improve transport efficiency of a given ion beam of a given ion species by selectively applying a second Eigenmode excitation frequency to select acceleration stages, such as the downstream stages, where ion energy is relatively higher.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An apparatus, comprising:
   a radio frequency (RF) power assembly, arranged to output an RF signal;
   a resonator, coupled to receive the RF signal, the resonator comprising a first output end and a second output end; and
   a drift tube assembly, arranged to transmit an ion beam, and coupled to the resonator, the drift tube assembly comprising:
   a first drift tube electrode, coupled to the first output end; and
   a second drift tube electrode, coupled to the second output end and separated from the first drift tube electrode by a first gap,
   wherein the RF power assembly comprises an RF voltage source and a controller that is switchable to switch output to the resonator from a first Eigenmode frequency to a second Eigenmode frequency,
   wherein at the first Eigenmode frequency: a first voltage V1 at the first drift tube electrode is $\pi$ radians out of phase with a second voltage V2 of the second drift tube electrode; and
   wherein at the second Eigenmode frequency: a voltage at the first drift tube electrode has a same magnitude and a same polarity as a voltage at the second drift tube electrode.

2. The apparatus of claim 1, wherein the drift tube assembly comprises a triple gap accelerator configuration, wherein a first grounded drift tube electrode is disposed upstream from the first drift tube electrode and is separated from the first drift tube by a second gap; and wherein a second grounded drift tube electrode is disposed downstream from the second drift tube electrode and separated from the second drift tube electrode by a third gap.

3. The apparatus of claim 1, wherein the first Eigenmode frequency is at least 13.56 MHz.

4. The apparatus of claim 1, wherein the first Eigenmode frequency is 13.56 MHz, 20 MHz, or 27.12 MHz.

5. The apparatus of claim 1, wherein a ratio of the first Eigenmode frequency to the second Eigenmode frequency is $1/\sqrt{2}$.

6. The apparatus of claim 1, wherein the first drift tube electrode comprises a first length, along an axial direction, and the second drift tube electrode comprises a second length, along the axial direction, and wherein the drift tube assembly defines a field free region along the axial direction, the field free region extending a distance along the axial direction equal to a sum of the first length, the second length, and the first gap.

7. A method of operating a linear accelerator, comprising:
   directing a first ion beam through a drift tube assembly, the drift tube assembly, comprising:
   a first drift tube electrode, coupled to a first output end of a resonator; and
   a second drift tube electrode, coupled to a second output end of the resonator and separated from the first drift tube electrode by a first gap;
   delivering a first radio frequency (RF) signal to the resonator at a first frequency, the first frequency representing a second Eigenmode of the resonator;
   directing a second ion beam through the drift tube assembly, the second ion beam comprising a second mass/ charge (M/q) ratio, wherein the first ion beam comprises a first M/q ratio, less than the second M/q ratio; and delivering a second RF signal to the resonator at a second frequency, the second frequency representing a first Eigenmode of the resonator, wherein at the first Eigenmode frequency: a first voltage V1 at the first drift tube electrode is π radians out of phase with a second voltage V2 of the second drift tube electrode; and wherein at the second Eigenmode frequency: a voltage at the first drift tube electrode has a same magnitude and a same polarity as a voltage at the second drift tube electrode.

8. The method of claim 7,
wherein at the first frequency:
the voltage at the first drift tube electrode and the voltage at the second drift tube electrode is given by $V=V_0 \cos(\omega t)$; and wherein at the second frequency:
the first voltage V1 at the first drift tube electrode is given by $V1=V_0 \cos(\omega t)$, and the second voltage V2 of the second drift tube electrode is given by $V2=V_0 \cos(\omega t + \pi)$.

9. The method of claim 7, wherein:
the second ion beam comprising a second energy, wherein the first ion beam comprises a first energy, greater than the second energy.

10. The method of claim 7, wherein the linear accelerator comprises a plurality of acceleration stages, wherein the first AC drift tube electrode and the second AC drift tube electrode are disposed in a downstream acceleration stage of the linear accelerator, the method further comprising:
directing the first ion beam through a second drift tube assembly, disposed in an upstream stage of the linear accelerator, upstream with respect to the downstream acceleration stage, the second drift tube assembly, comprising:
a third AC drift tube electrode, coupled to a first output end of a second resonator; and
a fourth AC drift tube electrode, coupled to a second output end of the second resonator and separated from the second AC drift tube electrode by a second gap; and
delivering a second RF signal to the second resonator at a second frequency, the second frequency representing a first Eigenmode of the resonator.

11. The method of claim 10, wherein the upstream acceleration stage receives the ion beam at a first ion energy, and
wherein the downstream stage receives the ion beam at a second ion energy, greater than the first ion energy.

12. The method of claim 7, wherein the drift tube assembly comprises a triple gap accelerator configuration, wherein a first grounded drift tube electrode is disposed upstream from the first AC drift tube electrode and is separated from the first AC drift tube electrode by a second gap; and
wherein a second grounded drift tube electrode is disposed downstream from the second AC drift tube electrode and separated from the second AC drift tube electrode by a third gap.

13. The method of claim 7, wherein the first frequency is at least 13.56 MHz.

14. The method of claim 13, wherein the first frequency is 13.56 MHz, 20 MHz, or 27.12 MHz.

15. The method of claim 7, wherein a ratio of the first frequency to the second frequency is $1/\sqrt{2}$.

16. The method of claim 7, wherein the a first AC drift tube electrode comprises a first length, along an axial direction, and the second AC drift tube electrode comprises a second length, along the axial direction, and wherein the drift tube assembly defines a field free region along the axial direction, the field free region extending a distance along the axial direction equal to a sum of the first length, the second length, and the first gap.

17. A high energy ion implantation system, comprising:
an ion source and extraction system, arranged to generate an ion beam at a first energy;
a linear accelerator, disposed downstream of the ion source, the linear accelerator arranged to accelerate the ion beam to a second energy, greater than the first energy, wherein the linear accelerator comprises a plurality of acceleration stages; and
an RF power system, comprising a plurality of RF power assemblies, and arranged to output a plurality of RF signals individually to the plurality of acceleration stages;
wherein the RF power system comprises an RF voltage source and a controller that is arranged to send a first RF signal to the linear accelerator corresponding to a first Eigenmode frequency for a first resonator of the plurality of acceleration stages, and to send a second RF signal to the linear accelerator corresponding to a second Eigenmode frequency for a second resonator of the plurality of acceleration stages, wherein, for a given resonator of the first resonator and the second resonator:
at the first Eigenmode frequency, a first voltage V at a first drift tube electrode is π radians out of phase with a second voltage V2 of a second drift tube electrode; and
at the second Eigenmode frequency, an oscillating voltage at the first drift tube electrode has a same magnitude and a same polarity as an oscillating voltage at the second drift tube electrode.

18. The high energy ion implantation system of claim 17, wherein the first resonator and the second resonator are a single resonator, and correspond to a given acceleration stage of the linear accelerator,
wherein a first RF power assembly of the plurality of RF power assemblies is coupled to the single resonator, and is switchable to switch output from the first RF signal to the second RF signal.

* * * * *

UNITED STATES PATENT AND TRADEMARK OFFICE
CERTIFICATE OF CORRECTION

PATENT NO. : 11,388,810 B2
APPLICATION NO. : 17/024295
DATED : July 12, 2022
INVENTOR(S) : Peter F. Kurunczi, David T. Blahnik and Frank Sinclair It is certified that error appears in the above-identified patent and that said Letters Patent is hereby corrected as shown below:

In the Drawings

In Figure 1A,
"40A" should be changed to "20A";
"40B" should be changed to "20B".

In Figure 3, and on the title page, in the illustrative print figure,
"$V2 = V_o \cos(\omega t + \pi)$" should be "$V2 = V_o \cos(\omega t)$".

Signed and Sealed this
Eighteenth Day of July, 2023

Katherine Kelly Vidal
*Director of the United States Patent and Trademark Office*